United States Patent
Chen et al.

(10) Patent No.: US 9,725,825 B2
(45) Date of Patent: Aug. 8, 2017

(54) ONE-DIMENSIONAL TITANIUM NANOSTRUCTURE AND METHOD FOR FABRICATING THE SAME

(71) Applicant: NATIONAL CHIAO TUNG UNIVERSITY, Hsinchu (TW)

(72) Inventors: Tze-Lung Chen, Su'ao Township, Yilan County (TW); Hsin-Tien Chiu, Taipei (TW); Chi-Young Lee, Jhudong Township, Hsinchu County (TW)

(73) Assignee: NATIONAL CHIAO TUNG UNIVERSITY, Hsinchu (TW)

(*) Notice: Subject to any disclaimer, the term of this patent is extended or adjusted under 35 U.S.C. 154(b) by 0 days.

(21) Appl. No.: 15/412,805

(22) Filed: Jan. 23, 2017

(65) Prior Publication Data

US 2017/0130361 A1 May 11, 2017

Related U.S. Application Data

(62) Division of application No. 13/846,047, filed on Mar. 18, 2013, now abandoned.

(30) Foreign Application Priority Data

Jan. 4, 2013 (TW) .............................. 102100224 A

(51) Int. Cl.
*C30B 29/02* (2006.01)
*C23C 16/08* (2006.01)
(Continued)

(52) U.S. Cl.
CPC .............. *C30B 29/02* (2013.01); *C23C 16/08* (2013.01); *C23C 16/46* (2013.01); *C30B 25/16* (2013.01); *C30B 29/60* (2013.01); *C30B 29/602* (2013.01)

(58) Field of Classification Search
CPC ....... C30B 25/00; C30B 25/005; C30B 29/02; C30B 29/602; B82Y 40/00
See application file for complete search history.

(56) References Cited

U.S. PATENT DOCUMENTS

| 6,525,461 B1* | 2/2003 | Iwasaki | H01J 9/025 313/310 |
| 2009/0275143 A1* | 11/2009 | Misra | G01N 27/127 436/130 |
| 2012/0308818 A1* | 12/2012 | Sun | B82Y 30/00 428/368 |

FOREIGN PATENT DOCUMENTS

| TW | 200715375 | 4/2007 |
| TW | I289538 B | 11/2007 |

(Continued)

OTHER PUBLICATIONS

X. Wang et al. Evolution of titanium dioxide 1D nanostructures from surface-reaction-limited pulsed chemical vapor deposition, J. Mater. Res., vol. 28, No. 3, Feb. 14, 2013, pp. 270-279.*

(Continued)

*Primary Examiner* — Kelly M Gambetta
(74) *Attorney, Agent, or Firm* — Muncy, Geissler, Olds & Lowe, P.C.

(57) ABSTRACT

A one-dimensional titanium nanostructure and a method for fabricating the same are provided. A titanium metal reacts with titanium tetrachloride to form the one-dimensional titanium nanostructure on a heat-resistant substrate in a CVD method and under a reaction condition of a reaction temperature of 300-900° C., a deposition temperature of 200-850° C., a flow rate of the carrier gas of 0.1-50 sccm and a reaction time of 5-60 hours. The titanium nanostructure includes titanium nanowires, titanium nanobelts, flower-shaped titanium nanowires, titanium nanorods, titanium nanotubes, and titanium-titanium dioxide core-shell struc- (Continued)

tures. The titanium nanostructure can be densely and uniformly grown on the heat-resistant substrate. The present invention neither uses a template nor uses the complicated photolithographic process, solution preparation process, and mixing-coating process. Therefore, the process scale-up, cost down, and the simplified production process are achieved.

3 Claims, 8 Drawing Sheets

(51) Int. Cl.
  *C23C 16/46*   (2006.01)
  *C30B 29/60*   (2006.01)
  *C30B 25/16*   (2006.01)

(56) References Cited

FOREIGN PATENT DOCUMENTS

| TW | I297046 | 5/2008 |
|---|---|---|
| TW | 201125810 | 8/2011 |
| TW | I346721 | 8/2011 |
| TW | I353963 B | 12/2011 |

OTHER PUBLICATIONS

Wang et al. One-Dimensional Titanium Dioxide Nanomaterials: Nanowires, Nanorods, and Nanobelts, Chem. Rev. 2014, 114, 9346-9384.*

Nakamura et al., "Conducting nanowires in insulating ceramics," Nature Materials, vol. 2, pp. 453-456, Jul. 2003.

B.J. Inkson et al., "Thermal stability of Ti and Pt nanowires manufactured by $Ga^+$ focused ion beam," Journal of Microscopy, vol. 214, Pt 3, pp. 252-260, Jun. 2004.

C. Fournier et al., "Zn, Ti and Si nanowires by electrodeposition in ionic liquid," Electrochemistry Communications 13, pp. 1252-1255, 2011.

Y. Wu et al., "Direct Observation of Vapor-Liquid-Solid Nanowire Growth," J.Am. Chem. Soc., 123, pp. 3165-3166, 2001.

T. Chen et al., "Morphology Control of 1-D Titanium Nanostructures and Their Field Emission Properties," 2012 MRS Fall Meeting & Exhibit, National Chiao Tung University, Hsinchu, Taiwan, Nov. 29, 2012.

T. Chen et al., "Synthesis and Properties of Freestanding Titanium Metal Nanowires," http://etd.lib.nctu.edu.tw/cgi-bin/gs/tugsweb.cgi, National Chiao Tung University, Jul. 6, 2012.

* cited by examiner

ONE-DIMENSIONAL TITANIUM NANOSTRUCTURE AND METHOD FOR FABRICATING THE SAME

CROSS-REFERENCE TO RELATED APPLICATIONS

This application is a Divisional of co-pending application Ser. No. 13/846,047, filed on Mar. 18, 2013, for which priority is claimed under 35 U. S.C. §120; and this application claims priority of Application No 102100224 filed in Taiwan on Jan. 4, 2013 under 35 U.S.C. §119; the entire contents of all of which are hereby incorporated by reference.

BACKGROUND OF THE INVENTION

Field of the Invention

The present invention relates to a metallic nanostructure synthesis technology, particularly to a one-dimensional titanium nanostructure and a method for fabricating the same.

Description of the Related Art

The current metallic nanostructure synthesis technology includes a photolithographic method, a hard template method, a seed-mediated growth method and a de-alloy method.

In the photolithographic method, a layer of photoresist is coated on a substrate and illuminated by the light filtered by a photomask. The pattern of the photomask reflects incident light. The light passing the photomask has a pattern identical to the pattern of the photomask and selectively exposes the photoresist coated on the substrate, whereby the pattern of the photomask is completely duplicated to the photoresist. After the abovementioned exposing step, the exposed photoresist is developed to reproduce the pattern of the photomask on the photoresist. Then, the photoresist is removed to obtain the desired nanowire. The method has disadvantages of expensive equipment and complicated processes. Further, the wavelength of the laser limits the size of nanowires.

The hard template method uses a polymeric material, a porous template or a biomaterial as the template for growing a special metallic nanostructure. The template is placed on a substrate, and a metallic material is deposited on the template with an electrodeposition method, a PVD (Physical Vapor Deposition) method, or a solution reduction method. Then, the template is removed to obtain a metallic nanostructure. The metallic nanostructure fabricated by the method is likely to have many tumbling defects. The size of the nanostructure is limited by the pore size or line width of the template. Besides, the method needs to fabricate a template beforehand and thus has a very complicated process.

The seed-mediated growth method is a liquid-phase synthesis method using a solution containing a reducing agent and a surfactant. The surfactant is a key factor in the liquid-phase method, not only preventing metallic nanoparticles from agglomeration or precipitation in solution but also facilitating the anisotropic growth of the metallic nanoparticles. The surfactant molecules have a hydrophilic terminal and a hydrophobic terminal and are likely to self-assemble to form micelles having various shapes. The micelles may function as templates to form nanostructures having a special geometrical shape. However, the method has a low yield in the scaled-up process. Besides, the nanostructures fabricated by the method are in form of powder. While the nanostructures are intended to apply to a heat-resistant substrate, the powder must be mixed with some agents to form a paste. Then, the paste is coated on the substrate. However, the mixing-coating process may vary the characteristic of the nanostructures. Besides, the uniformity of the mixing-coating process may affect the performance of the nanostructures.

SUMMARY OF THE INVENTION

The primary objective of the present invention is to provide a one-dimensional titanium nanostructure and a method for fabricating the same, wherein a CVD (Chemical Vapor Deposition) method is used to fabricate a high surface area titanium nanostructure on a heat-resistance substrate, whereby is effectively reduced the fabrication cost and shortened the fabrication process, and whereby is scaled up the fabrication process.

Another objective of the present invention is to provide a one-dimensional titanium nanostructure and a method for fabricating the same, wherein a simple CVD system is used to fabricate one-dimensional titanium nanostructures with different morphologies, which are monocrystalline or polycrystalline and have a high aspect ratio, and which are densely and uniformly distributed on a heat-resistant substrate.

To achieve the abovementioned objectives, the present invention proposes a method for fabricating a one-dimensional titanium nanostructure, which comprises steps: placing a heat-resistant substrate and a titanium metal in a CVD reaction chamber; using a carrier gas to transport titanium tetrachloride into the CVD reaction chamber to make titanium tetrachloride react with the titanium metal to form titanium subchloride under a reaction condition of a reaction temperature of 300-900° C., a deposition temperature of 200-850° C., a flow rate of a carrier gas of 0.1-50 sccm and a reaction time of 5-60 hours, and letting titanium subchloride undergo disproportionation to form a one-dimensional titanium nanostructure on the heat-resistant substrate.

In the present invention, different reaction conditions achieve different-morphology one-dimensional titanium nanostructures. In one embodiment, titanium tetrachloride reacts with a titanium metal at a reaction temperature of 500-900° C., and a one-dimensional titanium nanostructure deposits on a heat-resistant substrate at a deposition temperature of 500-850° C. (800-850° C. preferably), under a reaction condition of a flow rate of a carrier gas of 0.1-10 sccm and a reaction time of 8-30 hours. Thereby, titanium tetrachloride reacts with the titanium metal to form a one-dimensional titanium nanowire.

In one embodiment, titanium tetrachloride reacts with a titanium metal at a reaction temperature of 500-900° C., and a one-dimensional titanium nanostructure deposits on a heat-resistant substrate at a deposition temperature of 475-825° C. (775-825° C. preferably), under a reaction condition of a flow rate of the carrier gas of 0.1-10 sccm and a reaction time of 5-30 hours. Thereby, titanium tetrachloride reacts with the titanium metal to form a one-dimensional titanium nanobelt.

In one embodiment, a heat-resistant substrate having a roughened surface is used. Titanium tetrachloride reacts with a titanium metal at a reaction temperature of 700-900° C., and a one-dimensional titanium nanostructure deposits on the heat-resistant substrate at a deposition temperature of 475-825° C. (600-800° C. preferably), under a reaction condition of a flow rate of a carrier gas of 10-20 sccm and a reaction time of 15-60 hours. Next, stop supplying titanium tetrachloride to the reaction chamber, and keep heating the reaction chamber for 3-10 hours. Then, let the reaction chamber cool down to an ambient temperature, and meanwhile remove the residual titanium tetrachloride in the CVD reaction chamber. Thus is obtained a flower-shaped titanium nanowire.

In one embodiment, titanium tetrachloride reacts with a titanium metal at a reaction temperature of 700-900° C., and a one-dimensional titanium nanostructure deposits on a heat-resistant substrate at a deposition temperature of 475-825° C. (600-800° C. preferably), under a reaction condition of a flow rate of the carrier gas of 10-20 sccm and a reaction time of 15-60 hours. Next, stop supplying titanium tetrachloride to the reaction chamber, and keep heating the reaction chamber for 3-10 hours. Then, let the reaction chamber cool down to an ambient temperature, and meanwhile remove the residual titanium tetrachloride in the CVD reaction chamber. Thus is obtained a titanium nanorod.

In one embodiment, titanium tetrachloride reacts with a titanium metal at a reaction temperature of 700-900° C., and a one-dimensional titanium nanostructure deposits on a heat-resistant substrate at a deposition temperature of 475-825° C. (600-800° C. preferably), under a reaction condition of a flow rate of the carrier gas of 10-20 sccm and a reaction time of 15-60 hours. Next, stop supplying titanium tetrachloride to the reaction chamber, and directly cool the reaction chamber to an ambient temperature and then exposed to atmosphere. Thus is obtained a titanium-titanium dioxide core-shell structure having a titanium core and a titanium dioxide shell encapsulating the titanium core.

In one embodiment, titanium tetrachloride reacts with a titanium metal at a reaction temperature of 700-900° C., and a one-dimensional titanium nanostructure deposits on a heat-resistant substrate at a deposition temperature of 475-800° C. (600-800° C. preferably), under a reaction condition of a flow rate of the carrier gas of 10-50 sccm and a reaction time of 15-60 hours. Next, stop supplying titanium tetrachloride to the reaction chamber, and keep heating the reaction chamber for 3-10 hours. Then, let the reaction chamber cool down to an ambient temperature, and meanwhile remove the residual titanium tetrachloride in the CVD reaction chamber. Thus is obtained a titanium nanotube.

The present invention also proposes a one-dimensional titanium nanostructure, which is fabricated according to the abovementioned method. The one-dimensional titanium nanostructure of the present invention may be monocrystalline or polycrystalline. The one-dimensional titanium nanostructure of the present invention can be grown on any heat-resistant substrate. The one-dimensional titanium nanostructure of the present invention may be in form of titanium nanowires, titanium nanobelts, flower-shaped titanium nanowires, titanium nanorods, titanium nanotubes and titanium-titanium dioxide core-shell structures. The nanowire has a diameter of 20-50 nm and a length of 2-50 μm. The titanium nanobelt has a diameter of 20-150 nm and a length of 1-50 μm. The flower-shaped titanium nanowire has a diameter of 30-100 nm and a length of 2-9 μm. The titanium nanorod has a diameter of 30-100 nm and a length of 2-9 μm. The titanium-titanium dioxide core-shell structure has a titanium core and a titanium dioxide shell encapsulating the titanium core; the titanium core has a diameter of 20-100 nm and a length of 2-10 μm; the titanium dioxide shell has a thickness of 5-50 nm. The titanium nanotube has a diameter of 10-100 nm and a length of 0.1-9 μm.

Below, embodiments are described in detail in cooperation with drawings to make easily understood the objectives, characteristics, and functions of the present invention.

DETAILED DESCRIPTION OF THE INVENTION

Figure 1:
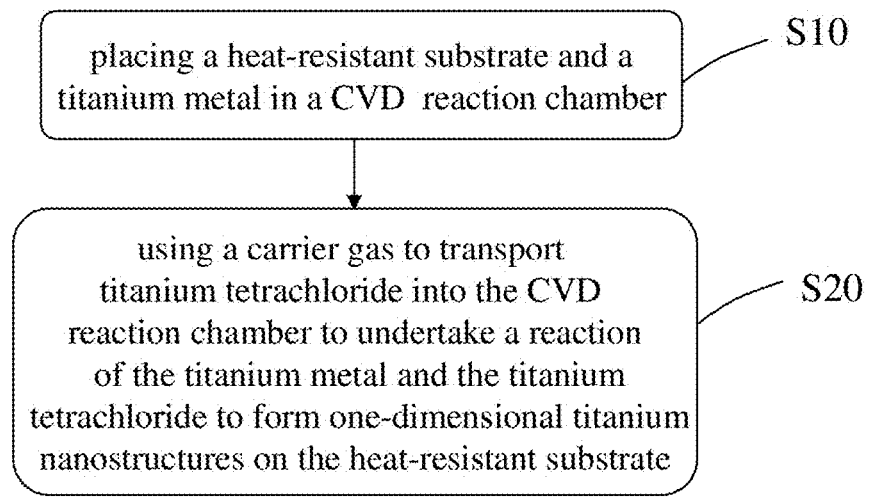
FIG. 1 is a flowchart of a method for fabricating a one-dimensional titanium nanostructure according to one embodiment the present invention.

The present invention provides a method for fabricating a one-dimensional titanium nanostructure, which uses a CVD method to grow a one-dimensional titanium nanostructure. Refer to FIG. 1. The method of the present invention comprises Step S10 and Step S20.

In Step S10, respectively place a powder of a titanium metal and a heat-resistant substrate in a high temperature region and a low temperature region of a high temperature-resistant quartz tube of a CVD reaction chamber. The heat-resistant substrate may be made of any commercially-available heat-resistant material, such as graphite. The high temperature region and the low temperature region are respectively the region where the titanium metal reacts with titanium tetrachloride and the region where the product is generated. The temperature of the high temperature region and the temperature of the low temperature region are respectively referred to as the reaction temperature and the deposition temperature.

In Step S20, use a carrier gas (such as argon) to transport titanium tetrachloride ($TiCl_4$) to the quartz tube of the CVD reaction chamber to make titanium tetrachloride react with the titanium metal, wherein the flow rate of the carrier gas is about 0.1-50 sccm; the reaction temperature is set to be 300-900° C.; the deposition temperature is set to be 200-850° C.; the reaction time is 5-60 hours. The reaction product is titanium subchloride. Titanium subchloride will thermolyze spontaneously to form titanium atoms. The vapor titanium atoms further deposit on the heat-resistant substrate to grow a one-dimensional titanium nanostructure.

In the present invention, different reaction conditions obtain different one-dimensional titanium nanostructures. The one-dimensional titanium nanostructures can be identified with SEM (Scanning Electron Microscope) and X-ray diffractometry to learn the appearances and crystal structures Below are described various morphologies of the obtained one-dimensional titanium nanostructures, including titanium nanowires, titanium nanobelts, flower-shaped titanium nanowires, titanium nanorods, titanium nanotubes, and titanium-titanium dioxide core-shell structures.

(1) Titanium Nanowire

Titanium nanowires are obtained under a reaction condition of a reaction temperature of 500-900° C., a deposition temperature of 500-850° C. (800-850° C. preferably), a flow rate of a carrier gas of 0.1-10 sccm and a reaction time of 8-30 hours.

Figure 2A:
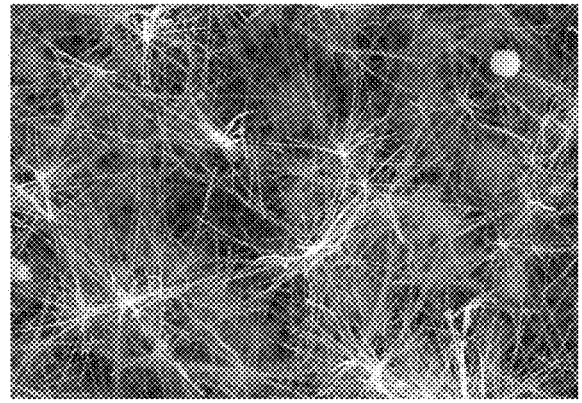
FIG. 2*a* and FIG. 2*b* are respectively a low-magnification SEM image and a high-magnification SEM image of a nanowire obtained under a condition of a deposition temperature of 700° C. and an argon flow rate of 0.1-5 sccm according to one embodiment the present invention.
Figure 2B:
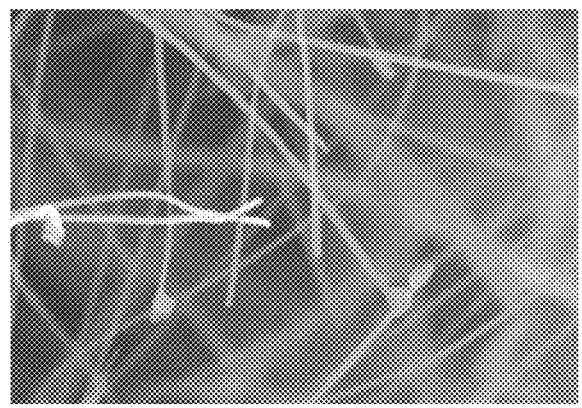

The titanium nanowire obtained by the CVD method of the present invention has a diameter of 20-50 nm and a length of 2-50 μm. Refer to FIG. 2a and FIG. 2b respectively a low-magnification SEM image and a high-magnification SEM image of the nanowires obtained under a condition of a deposition temperature of 700° C. and an argon flow rate of 0.1-5 sccm. The nanowire is monocrystalline or polycrystalline and has an FCC (Face Centered Cubic) lattice structure.

(2) Titanium Nanobelt

Titanium nanobelts are obtained under a reaction condition of a reaction temperature of 500-900° C., a deposition temperature of 475-825° C. (700-850° C. preferably), a flow rate of a carrier gas of 0.1-10 sccm and a reaction time of 5-30 hours.

Figure 3A:
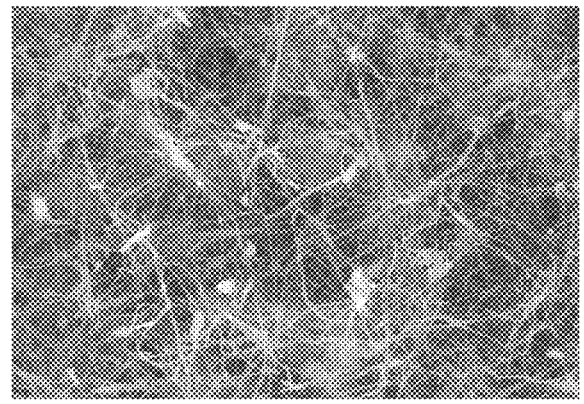
FIG. 3*a* and FIG. 3*b* are respectively a low-magnification SEM image and a high-magnification SEM image of a nanobelt according to one embodiment the present invention.
Figure 3B:
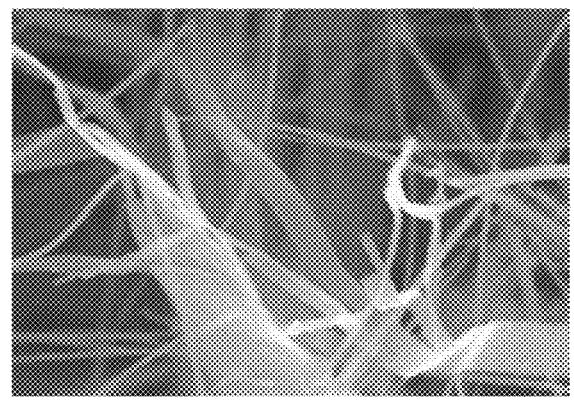

The titanium nanobelt obtained by the CVD method of the present invention has a diameter of 20-150 nm and a length of 1-50 μm. The reaction condition of the nanobelt is similar to but slightly lower than that of the nanowire. Sometimes, the nanowire and the nanobelt appear simultaneously. Refer to FIG. 3a and FIG. 3b respectively a low-magnification SEM image and a high-magnification SEM image of the nanobelts. The titanium nanobelt is monocrystalline or polycrystalline and has an FCC lattice structure.

(3) Flower-Shaped Titanium Nanowire

Flower-shaped titanium nanowires are achieved with a heat-resistant substrate roughened to have a rugged surface. A heat-resistant substrate having a 20 nm roughness observable under an electron microscope is sufficient to fabricate flower-shaped titanium nanowires.

The flower-shaped titanium nanowires are obtained under a reaction condition of a reaction temperature of 700-900° C., a deposition temperature of 475-825° C. (600-800° C. preferably), a flow rate of a carrier gas of 10-20 sccm and a reaction time of 15-60 hours. After reaction, stop supplying titanium tetrachloride to the reaction chamber, and keep heating the reaction chamber for 3-10 hours. Next, cool the reaction chamber to an ambient temperature. Meanwhile, completely remove the residual titanium tetrachloride from the reaction chamber. Then, take the product out of the reaction chamber.

Figure 4A:
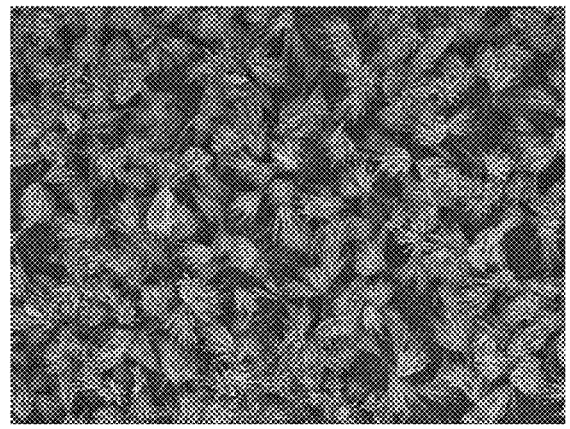
FIG. 4*a* and FIG. 4*b* are respectively a low-magnification SEM image and a high-magnification SEM image of a flower-shaped titanium nanowire according to one embodiment the present invention.
Figure 4B:
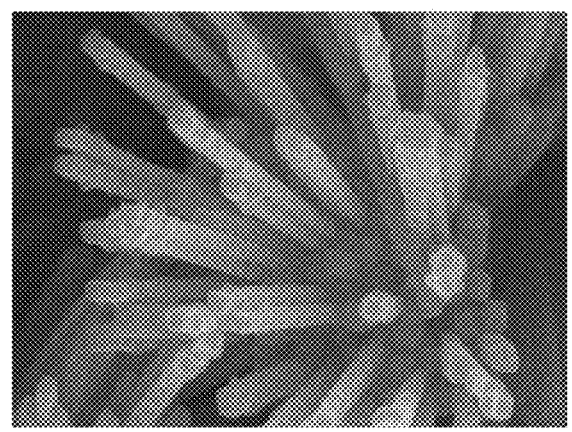

The flower-shaped titanium nanowire obtained by the CVD method of the present invention has a diameter of 30-100 nm and a length of 2-9 μm. Refer to FIG. 4a and FIG. 4b respectively a low-magnification SEM image and a high-magnification SEM image of the flower-shaped titanium nanowires. The flower-shaped titanium nanowires are nanowires growing from a single nucleus. The flower-shaped titanium nanowire is monocrystalline or polycrystalline and has an FCC lattice structure.

(4) Titanium Nanorod

Titanium nanorods are different from the flower-shaped titanium nanowires in that the titanium nanorod is fabricated on a relatively smooth heat-resistant substrate.

The titanium nanorods are obtained under a reaction condition of a reaction temperature of 700-900° C., a deposition temperature of 475-825° C. (600-800° C. preferably), a flow rate of a carrier gas of 10-20 sccm and a reaction time of 15-60 hours. After reaction, stop supplying titanium tetrachloride to the reaction chamber, and keep heating the reaction chamber for 3-10 hours. Next, cool the reaction chamber to an ambient temperature. Meanwhile, completely remove the residual titanium tetrachloride from the reaction chamber. Then, take the product out of the reaction chamber. The product will appear at the front side and the rear side of the reaction chamber simultaneously.

Figure 5A:
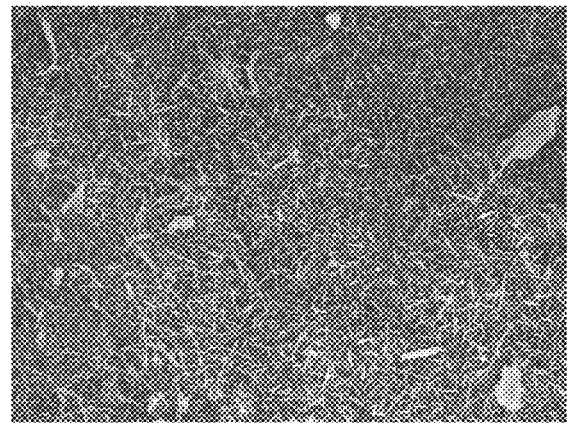
FIG. 5*a* and FIG. 5*b* are respectively a low-magnification SEM image and a high-magnification SEM image of a nanorod according to one embodiment the present invention.
Figure 5B:
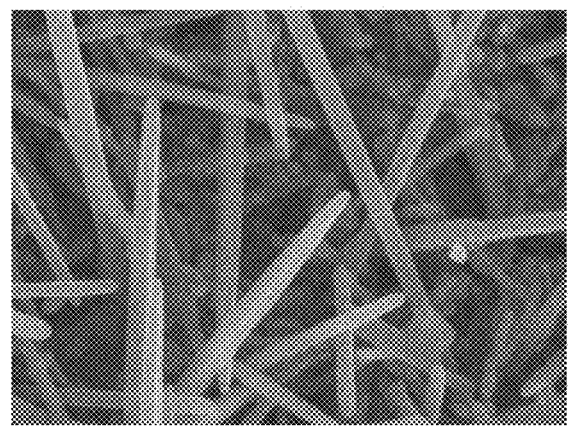

The titanium nanorod obtained by the CVD method of the present invention has a diameter of 30-100 nm and a length of 2-9 μm. Refer to FIG. 5a and FIG. 5b respectively a low-magnification SEM image and a high-magnification SEM image of the nanorods. The titanium nanorod is monocrystalline or polycrystalline and has an FCC lattice structure.

(5) Titanium-Titanium Dioxide Core-Shell Structure

Titanium-titanium dioxide core-shell structures are obtained under a reaction condition of a reaction temperature of 700-900° C., a deposition temperature of 475-825° C. (600-800° C. preferably), a flow rate of a carrier gas of 10-20 sccm and a reaction time of 15-60 hours. After reaction, stop supplying titanium tetrachloride to the reaction chamber, and directly cool the reaction chamber to an ambient temperature and then exposed to air. Then, take the product out of the reaction chamber.

Figure 6A:
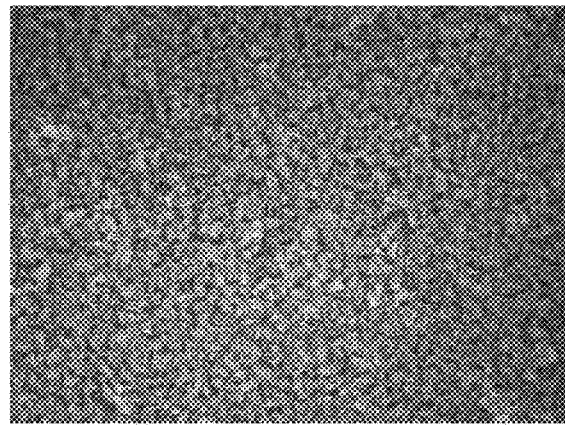
FIGS. 6*a*-6*c* are respectively SEM images of a titanium-titanium dioxide core-shell structure from a low-magnification to a high-magnification in sequence according to one embodiment the present invention.
Figure 6B:
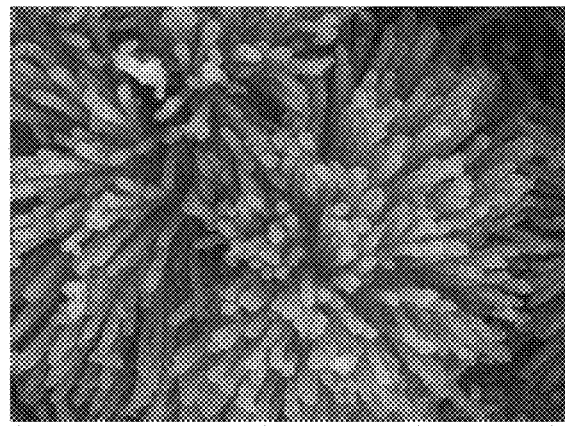
Figure 6C:
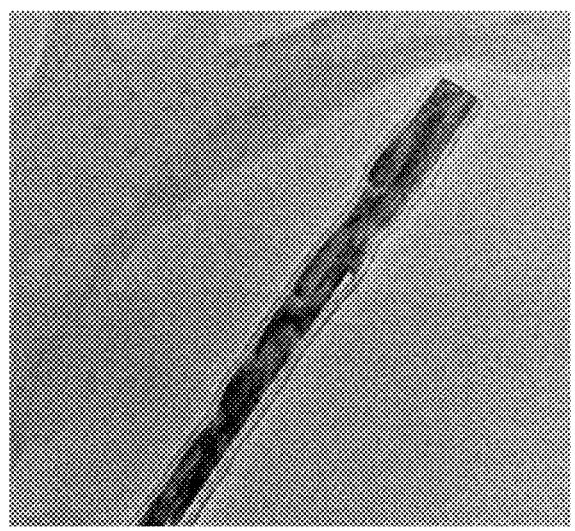

The titanium-titanium dioxide core-shell structure obtained by the CVD method of the present invention has a titanium core and a titanium dioxide shell encapsulating the titanium core. The titanium core has a diameter of 20-100 nm and a length of 2-10 μm. The titanium dioxide shell has a thickness of 5-50 nm. Refer to FIGS. 6a-6c respectively SEM images of the titanium-titanium dioxide core-shell structures from a low-magnification to a high-magnification in sequence. From FIG. 6c are clearly observed the core and the oxide layer encapsulating the core of the one-dimensional titanium-titanium dioxide core-shell structure. Each of the titanium core and the titanium dioxide shell is monocrystalline or polycrystalline. The titanium core has an FCC lattice structure. The titanium dioxide layer is Anatase titanium dioxide, Rutile titanium dioxide or Brookite titanium dioxide. Via element identification, it is known that the titanium-titanium dioxide core-shell structure contains titanium and titanium oxide. Via XPS (X-ray Photoelectron Spectroscopy), it is learned that the inner layer is a titanium core and the outer layer is a titanium dioxide layer.

(6) Titanium Nanotube

Titanium nanotubes are obtained under a reaction condition of a reaction temperature of 700-900° C., a deposition temperature of 475-800° C. (600-800° C. preferably), a flow rate of a carrier gas of 10-50 sccm and a reaction time of 15-60 hours. After reaction, stop supplying titanium tetrachloride to the reaction chamber, and keep heating the reaction chamber for 3-10 hours. Next, cool the reaction chamber to an ambient temperature. Next, completely remove the residual titanium tetrachloride from the reaction chamber. Then, take the product out of the reaction chamber.

Figure 7A:
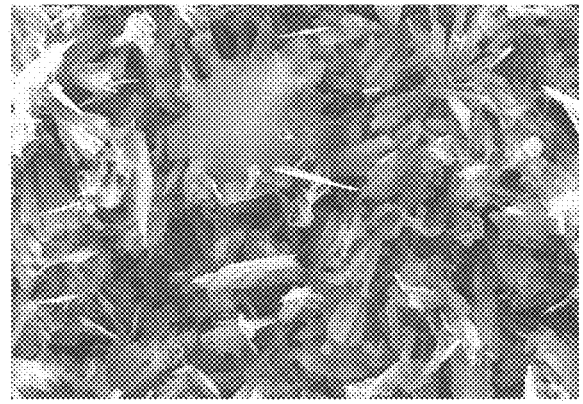
FIG. 7*a* and FIG. 7*b* are respectively a low-magnification SEM image and a high-magnification SEM image of a nanotube according to one embodiment the present invention.
Figure 7B:
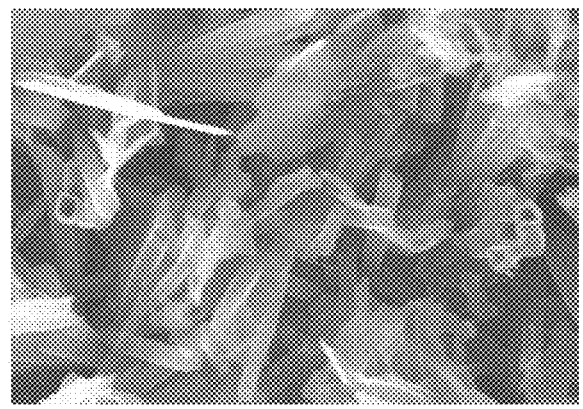

The titanium nanotube obtained by the CVD method of the present invention has a diameter of 10-100 nm and a length of 0.1-9 μm. Refer to FIG. 7a and FIG. 7b respectively a low-magnification SEM image and a high-magnification SEM image of the nanotubes. The titanium nanotube is monocrystalline or polycrystalline and has an FCC lattice structure. Via XRD (X-Ray Diffraction) and EDS (Energy Dispersive Spectroscopy), it is known that the one-dimensional nanotube is made of a titanium metal.

In conclusion, the present invention discloses a one-dimensional titanium nanostructure and a method for fabricating the same, wherein a CVD method cooperates with different reaction conditions to form different-morphology one-dimensional titanium nanostructures on a heat-resistant substrate, including a titanium nanowire, a titanium nanobelt, a titanium flower-shaped nanowire, a titanium nanorod, a titanium nanotube and a titanium-titanium dioxide core-shell structure. Further, the titanium nanostructure can be densely and uniformly distributed on a heat-resistant substrate. Besides, the titanium nanostructure is monocrystalline or polycrystalline and has a high aspect ratio.

The present invention can fabricate high-surface area one-dimensional metallic nanostructures on a bendable heat-resistant substrate, neither using a template nor using the complicated photolithographic process, solution preparation process, and mixing-coating process. Thereby, the present invention can effectively shorten the fabrication process and reduce the fabrication cost. Further, the present invention can scale up the process. The present invention can apply to energy materials, optical elements, biosensors, light emitting elements, solar cells, photocatalysis devices, etc. Therefore, the present invention has very high commercial potential.

The embodiments described above are only to exemplify the present invention but not to limit the scope of the present invention. Any modification or variation according to the spirit of the present invention is to be also included within the scope of the present invention, which is based on the claims stated below.

What is claimed is:

1. A method for fabricating a one-dimensional titanium nanostructure, comprising steps:
    placing a heat-resistant substrate and a titanium metal in a CVD (Chemical Vapor Deposition) reaction chamber; and
    using a carrier gas to transport titanium tetrachloride into said CVD reaction chamber, undertaking a reaction of said titanium metal and said titanium tetrachloride to generate titanium subchloride, and letting said titanium subchloride thermolyze to form a one-dimensional titanium nanostructure on said heat-resistant substrate, under a reaction condition of a reaction temperature of 500-900° C., a deposition temperature of 500-850° C., a flow rate of a carrier gas of 0.1-10 sccm and a reaction time of 8-30 hours,
    wherein said heat-resistant substrate is made of graphite, and said carrier gas is nitrogen, and wherein said one-dimensional titanium nanostructure is a titanium nanowire having a diameter of 20-50 nm and a length of 2-50 μm, and wherein said titanium nanowire is a monocrystalline titanium nanowire or a polycrystalline titanium nanowire.

2. The method for fabricating a one-dimensional titanium nanostructure according to claim 1, wherein said one-dimensional titanium nanostructure deposits on said heat-resistant substrate at a deposition temperature of 800-850° C.

3. The method for fabricating a one-dimensional titanium nanostructure according to claim 1, wherein said monocrystalline titanium nanowire has an FCC lattice structure.

* * * * *